United States Patent [19]

Cutler

[11] Patent Number: 4,862,108
[45] Date of Patent: Aug. 29, 1989

[54] FREQUENCY LOCKING CIRCUIT WITH SIDEBAND IMBALANCE CORRECTION

[75] Inventor: Gregory M. Cutler, Cupertino, Calif.
[73] Assignee: Hewlett-Packard Company, Palo Alto, Calif.
[21] Appl. No.: 192,041
[22] Filed: May 9, 1988
[51] Int. Cl.[4] ............................................. H03L 7/06
[52] U.S. Cl. ........................................ 331/9; 331/18; 331/25
[58] Field of Search ................... 331/9, 10, 11, 12, 17, 331/18, 23, 25

[56] References Cited

U.S. PATENT DOCUMENTS 4,631,498 12/1986 Cutler .............................. 331/23 X

OTHER PUBLICATIONS

Cutler, G. M., "Appendix A-Optical to Radio and Radio to Optical Frequency Locking" *A Dissertation Submitted to the Department of Physics and the Committee on Graduate Studies of Stanford University*, Mar. 1988, pp. 35–49.

*Primary Examiner*—David Mis
*Attorney, Agent, or Firm*—John A. Frazzini

[57] ABSTRACT

Circuit imperfections in phase modulators will introduce offsets in the servo error signals in frequency locking circuits. Such offsets will also cause a frequency offset. The frequency offset is first reduced by reducing or removing amplitude modulation at the modulating frequency in the modulated carrier signal. In the preferred embodiment, this is accomplished by a coupled servo which includes a matrix loop filter. After the amplitude modulation at the modulating frequency has been removed, sideband imbalance can be corrected by amplitude modulating the modulating signal so that the offset caused by sideband imbalance is reduced or eliminated. This will be the case provided that the integral of at least the third power of the amplitude modulation vanishes.

16 Claims, 4 Drawing Sheets

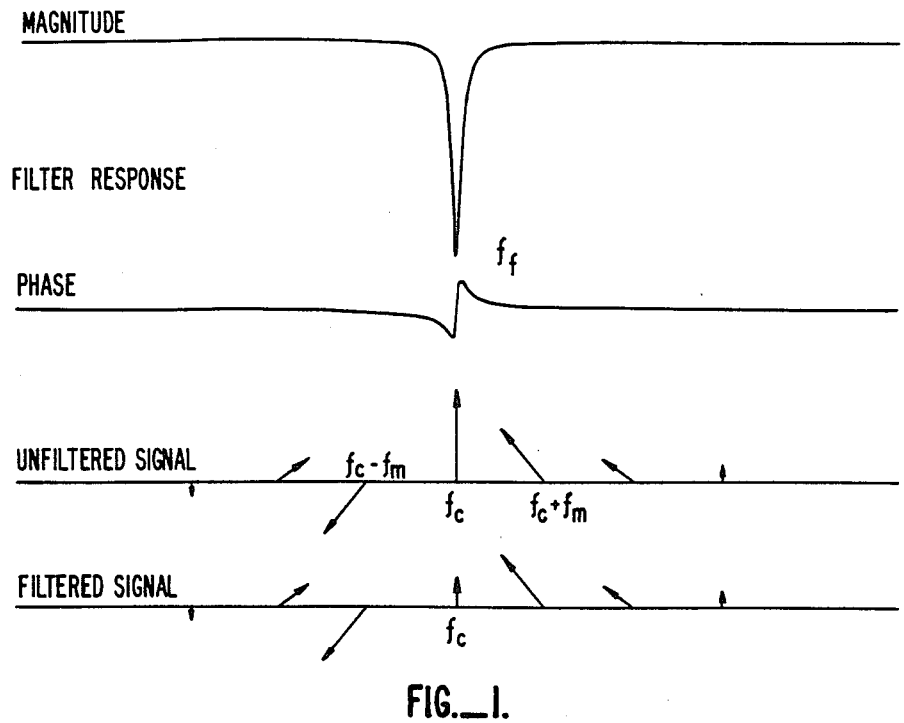
FIG._1.
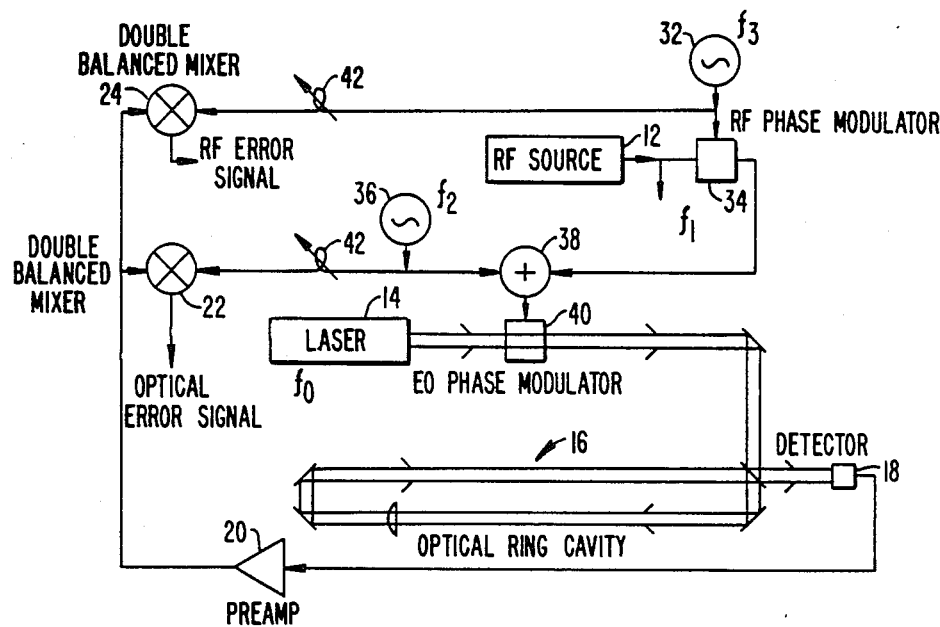
FIG._2.

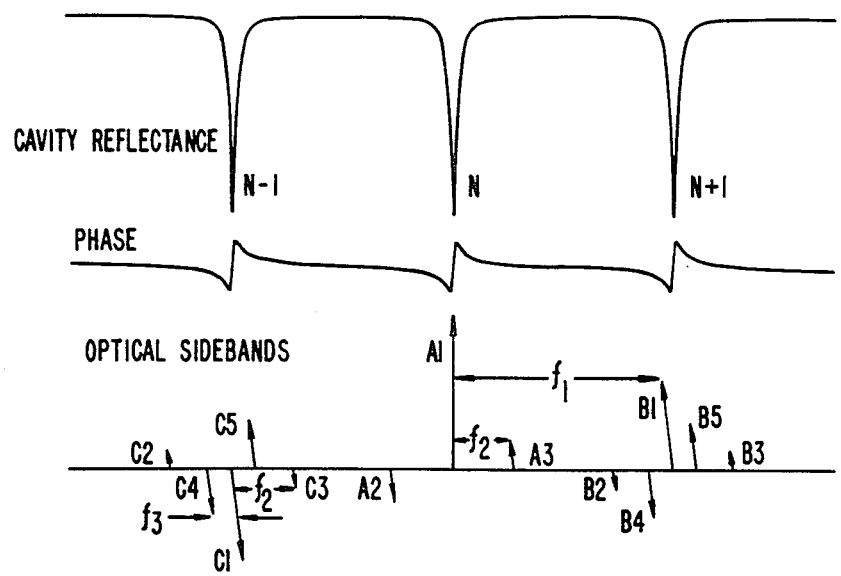
FIG.__3.
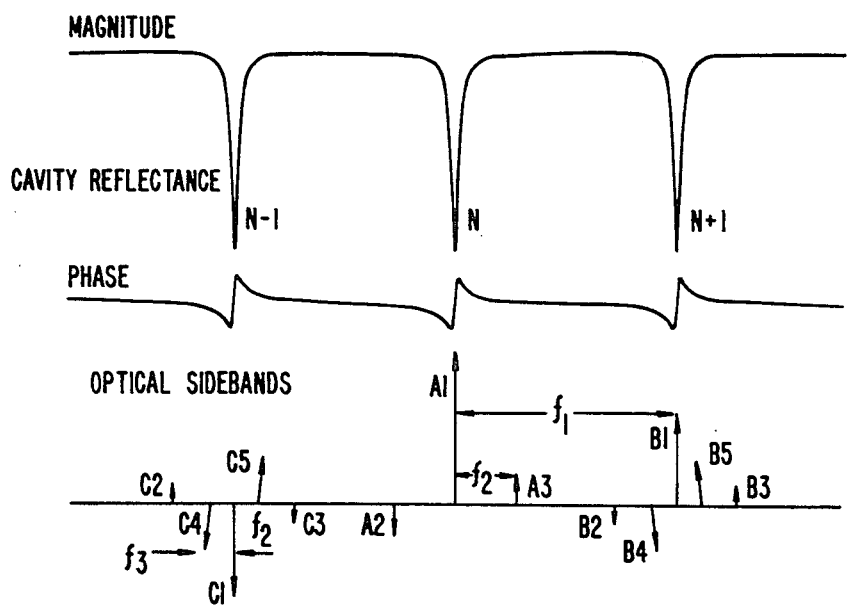
FIG.__4.

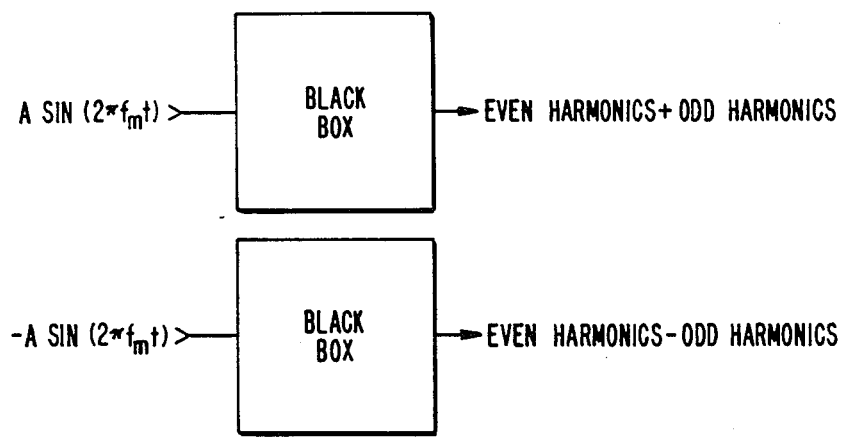
FIG._5.
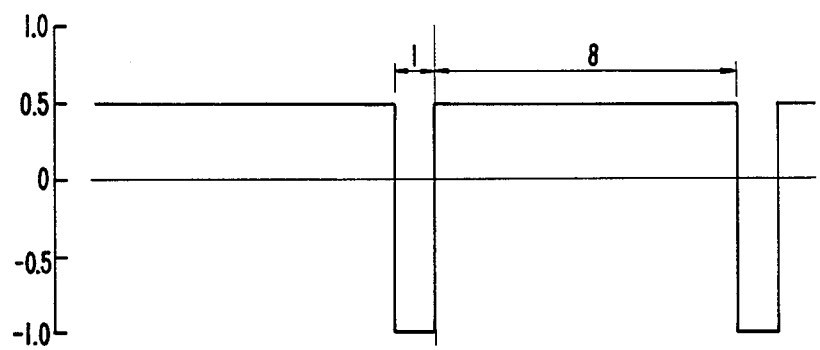
FIG._6.
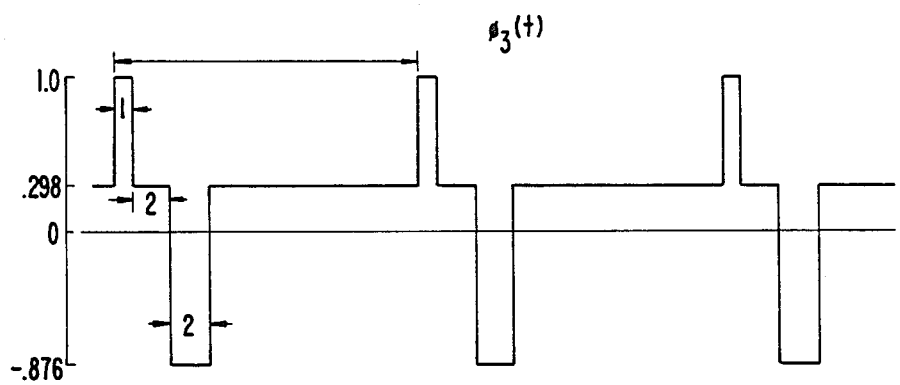
FIG._7.

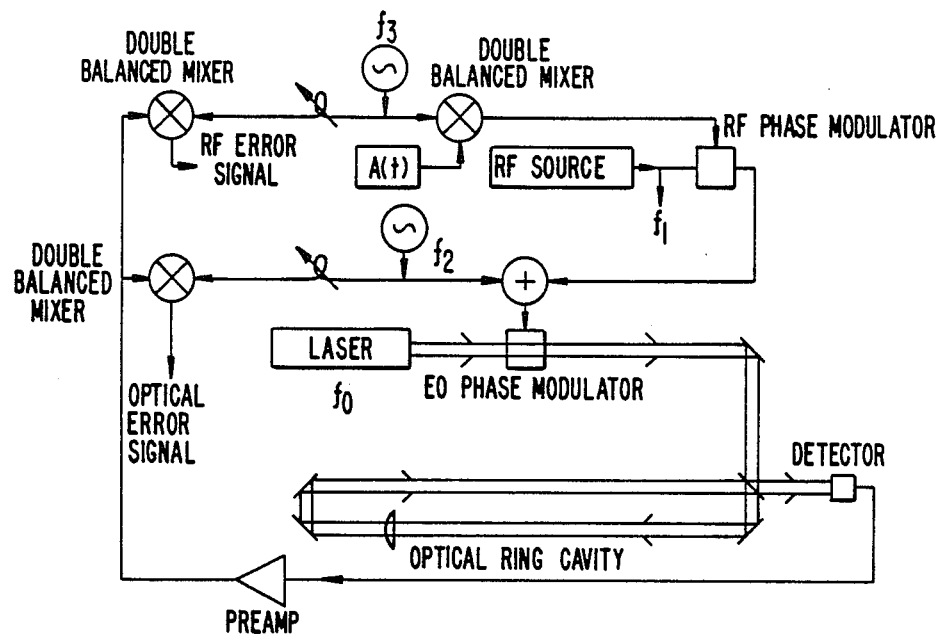
FIG._8.
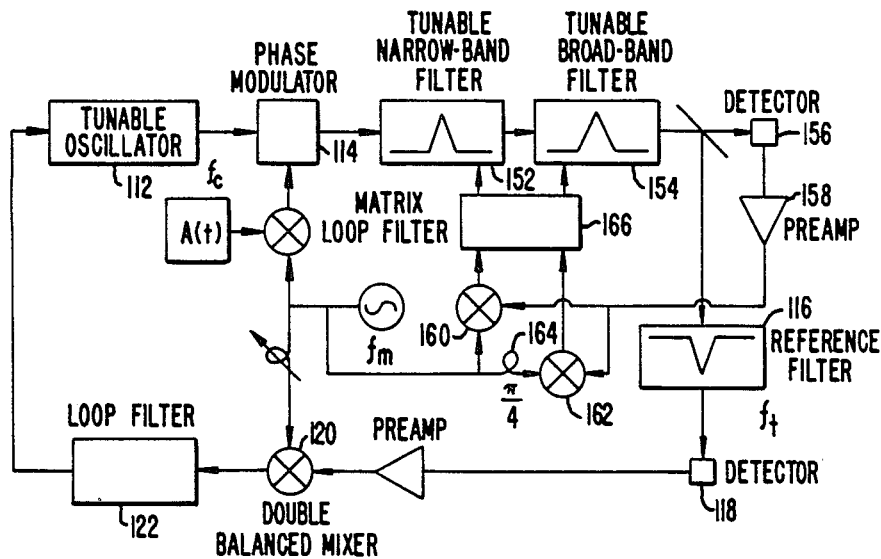
FIG._9.

FREQUENCY LOCKING CIRCUIT WITH SIDEBAND IMBALANCE CORRECTION

REFERENCE TO RELATED APPLICATION

This application is related to an U.S. application Ser. No. 181,129 entitled "Improved Frequency Locking Device" also filed by applicant in the U.S. Patent and Trademark Office on Apr. 13, 1988.

BACKGROUND OF THE INVENTION

This invention relates in general to frequency locking circuits and more particularly to an improved frequency locking circuit where frequency offsets caused by sideband imbalance are reduced.

In U.S. Pat. No. 4,631,498 to applicant, a wave meter/frequency locking technique is disclosed which is suitable for indirectly locking an optical frequency f to a radio frequency f' or for locking the radio frequency to the optical frequency. The indirect locking is accomplished by using a filter which has a characteristic frequency $f_f$. A beam of optical frequency f is phase modulated by a subcarrier signal of average frequency f' that is itself modulated at frequency f''. The modulated beam is passed through the filter to a detector to produce a detector output signal that has frequencies at linear integral sums of f' and f''. A pair of control signals are generated that are proportional to the amplitude of the two components of the detector output signal. These control signals are used separately in a pair of servo loops to separately establish fixed values of $f/f_f$ and $f'/f_f$. The value of $f/f_f$ is stepped to a different value. By measuring f'/f'' at each of these values of $f/f_f$, the value of f can be determined.

Imperfections in the phase or frequency modulation applied in the frequency locking circuit will cause a sideband asymmetry condition known as sideband imbalance. Such condition will cause a frequency offset in the device and is therefore undesirable. It is therefore desirable to provide frequency locking circuits in which frequency locking offsets caused by sideband imbalance are reduced.

SUMMARY OF THE INVENTION

One aspect of the invention is directed towards a frequency locking circuit comprising a source of a beam of continuous wave, coherent radiation of frequency $f_o$ and means for amplitude modulating a signal at frequency $f_3$ by a signal at frequency $f_e$ to provide a modulating signal, where the signal at $f_e$ is a periodic function A of time t, $A(f_e t)$, and $$\int_0^{1/f_e} A(f_e t)dt \neq 0, \quad \int_0^{1/f_e} [A(f_e t)]^3 dt = 0,$$

The circuit further comprises means for phase modulating the beam, in response to a compound signal which is the sum of a signal at frequency $f_2$ and a FM subcarrier at frequency $f_1$ that is phase modulated by the modulating signal, to produce a phase modulated beam. The circuit includes a filter through which the phase modulated beam passes, said filter having a periodic transfer function that has a characteristic frequency $f_f$ wherein the phase modulated beam has sidebands that recur at substantially the same period of the transfer function of the filter. The circuit further comprises a detector responsive to the filtered beam to produce a detector signal, first means responsive to the component of the detector signal substantially at frequency $f_2$, for adjusting the ratio of $f_o/f_f$ to a fixed value N and second means responsive to the component of the detector signal substantially at frequency $f_3$, for adjusting the ratio of $f_1/f_f$ to a fixed value M.

Another aspect of the invention is directed towards a frequency locking circuit comprising a source of a carrier signal at frequency $f_c$ and means for phase modulating the carrier signal by a first signal at frequency $f_m$ to produce a modulated carrier signal with sidebands, said phase modulating means containing imperfections so that the sidebands are imbalanced, said imbalance inducing modulation including amplitude modulation at $f_m$. The circuit further comprises means for reducing amplitude modulation at $f_m$ in the modulated carrier signal to provide an output signal, a filter for filtering the output signal to provide a filtered signal and a detector responsive to the filtered signal to produce a detector signal. The circuit comprises in addition means responsive to the component of the detector signal at frequency $f_m$ for adjusting the ratio $f_c/f_f$ to a fixed value N. The circuit is such that a time shift in the modulating signal at $f_m$ signal will cause substantially the same time shift in the detector signal. The frequency offset caused by sideband imbalance in the phase modulating means is reduced by reducing the amplitude modulation at $f_m$.

BRIEF DESCRIPTION OF THE DRAWINGS

FIG. 1 is a graphical illustration of a filtered and unfiltered carrier and sidebands of an arbitrary modulated signal with balanced sidebands along with the transfer function of a symmetric resonant filter, to illustrate the condition defined below as sideband imbalance.

FIG. 2 is a block diagram of a frequency locking circuit which includes the use of optical and RF error signals suitable for frequency locking.

FIG. 3 is a graphical illustration of the optical sideband groups with sideband imbalance from the optical phase modulator compared to the resonant mode of the filter in the circuit of FIG. 2.

FIG. 4 is a graphical illustration of the optical sideband groups with sideband imbalance from the RF phase modulator compared to the resonant mode of the filter in the circuit of FIG. 2.

FIG. 5 is a schematic diagram showing the time dependence of the harmonics of the output on the input to a portion of a frequency locking circuit where the black boxes are stationary.

FIG. 6 is a graphical illustration of an optimized envelope periodic function where integral of the third power of the function over a period of the function vanishes to illustrate a preferred embodiment of the invention.

FIG. 7 is a graphical illustration of an optimized envelope periodic function where integral of the third and fifth powers of the function over a period of the function vanish to illustrate an alternate embodiment of the invention.

FIG. 8 is a block diagram of a frequency locking circuit with an improved feature for correcting sideband imbalance caused by imperfections in the RF phase modulator to illustrate the preferred embodiment of one aspect of the invention.

FIG. 9 is a block diagram of a frequency locking circuit with features for correcting sideband imbalance to illustrate another aspect of the invention.

DETAILED DESCRIPTION OF THE INVENTION

First a sideband symmetry condition will be defined, and deviation from this condition will be defined as sideband imbalance. Thus sidebands that obey the symmetry of the equation are defined as "balanced". Deviation from this condition is defined as sideband imbalance. FIG. 1 is a graphical illustration of filtered and unfiltered carrier and sidebands of an arbitrary modulated signal (modulated at frequency $f_m$) with balanced sidebands placed next to the transfer function of a symmetric resonant filter to illustrate the above definition. In FIG. 1, the magnitudes of the carrier and sidebands are illustrated by the length of the arrows and the angles of the arrows from the vertical represent their arguments.

If the center frequency of the symmetric filter is tuned to the carrier frequency, the filtered signal will contain no amplitude modulation at odd multiples of $f_m$. Thus in reference to the first order sidebands of the unfiltered signal at frequencies $f_c \pm f_m$, for example, they are of equal lengths; the sum of their arguments is an odd integral multiple of $\pi$, so that the $[(f_c \pm f_m) - f_c]$ beat tones cancel. After the signal has been filtered, the sidebands in the filtered signal remain balanced. Hence presence of amplitude modulation at $f_m$ can be used as an indication of the detuning of the filter from the carrier frequency $f_c$. In other words, if circuit imperfections cause sideband imbalance, amplitude modulation at the modulating frequency $f_m$ will be present in the filtered signal even when there is no detuning, causing a closed loop frequency offset in the frequency locking circuit.

Before describing the invention in detail, it is necessary to first describe a frequency locking circuit which is the subject of the related application entitled "Improved Frequency Locking Device" referenced above. FIG. 2 and the following discussion in reference to FIG. 2 are taken from the related application.

As shown in FIG. 2, the RF signal from source 12 is modulated by a signal from source 32 at frequency $f_3$ by means of RF phase modulator 34. Source 36 supplies a signal at frequency $f_2$ which is added by adder 38 to the modulated RF signal to yield a compound signal which is used to modulate the laser beam through the EO phase modulator 40. The output of detector 18 is mixed by double balanced mixer 22 with the $f_2$ frequency signal to derive the optical error signal. In other words, the component of detector output at frequency $f_2$ is detected to yield the optical error signal. Mixer 24 mixes the output of detector 18 with an $f_3$ frequency signal to detect the component of detector output at frequency $f_3$ to yield the RF error signal. Individually adjustable delay lines 42 are used to adjust the reference phases to each of the two double balanced mixers to maximize the respective error signals.

The above described frequency locking circuit is the same as that of FIG. 1 of the related application "Improved Frequency Locking Device". The RF error signal or the optical error signal may be used to adjust the RF or laser frequencies to accomplish frequency locking.

In reference to FIGS. 1 and 2, circuit imperfections may cause the RF phase modulator or the optical phase modulator to produce imbalanced sidebands. This can appear as amplitude modulation in the detector signal at $f_2$ and $f_3$ even in the absence of detuning, causing a closed loop frequency offset in either servo loop which is of course undesirable.

FIG. 3 is a graphical illustration of the optical sideband groups with sideband imbalance from the optical phase modulator compared to the resonant mode of the optical cavity of FIG. 2. In reference to FIG. 2, it will be observed that the laser beam is modulated directly by signals of frequencies $f_1$, $f_2$. The imperfections of the optical phase modulator will therefore cause the sidebands B1, C1, A2, A3 to be tilted by a small angle as shown in FIG. 3. The RF signal is modulated by a signal at frequency $f_3$ and the resulting signal is used to modulate the laser beam. Since the sideband imbalance originates from the optical phase modulator and not the RF phase modulator, the sidebands B4, B5, C4, C5 are tilted by the same angle as sidebands B1, C1, A2, A3. Sidebands B2, B3, C2, C3 arise from further modulation of bands B1, C1 by a signal at frequency $f_2$. Therefore bands B2, B3, C2, C3 are tilted further relative to bands B1, C1 so that they are tilted twice as much compared to the remaining sidebands. The tilting of the sidebands in FIG. 3 illustrate the phase shifts of the beat tones. Because of the non-antisymmetric phase shifts, the $f_2$ ($A_3 - A_1$, $A_1 - A_2$) beat tones no longer cancel for zero optical detuning, resulting in amplitude modulation at frequency $f_2$ in the detector signal which will cause a frequency shift or offset in the optical servo loop. This fractional error, however, is very small and can usually be ignored. Nevertheless, it may be corrected if desired by applying essentially the same technique as that described below for correcting sideband imbalance introduced by the RF phase modulator.

FIG. 4 is a graphical illustration of optical sideband groups with sideband imbalance from the RF phase modulator compared to the resonant modes of the optical cavity in FIG. 2. Imperfections in the RF phase modulator will cause a closed loop frequency shift in the RF servo loop proportional to the RF sideband imbalance. However, this sideband imbalance will not affect the $f_2$ satellite bands or the main bands B1, C1. It affects only $f_3$ satellite bands as shown in FIG. 4. The fractional error in this frequency shift will be on the order of the sideband imbalance times the reciprocal of the product of the RF frequency to free spectral range ratio of the cavity M, and the finesse. In contrast to the optical sideband imbalance, this effect is not usually negligible. For example, a fractional sideband imbalance of $10^{-2}$ with a finesse of $10^2$, and $M = 10$ would cause a fractional error on the order of $10^{-5}$.

It is desirable to reduce this fractional error. Before discussing the feature of the invention for reducing such error, it is desirable to first explore a certain timing relationship. In reference to FIG. 2, it will be noted that the output of detector 18 bears a definite time relationship to the modulation input of the RF phase modulator 34. Thus, the path consisting of RF phase modulator 34, adder 38, phase modulator 40, cavity 16 and detector 18 form a stationary system which is independent of the absolute time, so that if the input to modulator 34 is shifted by a delay, the output of detector 18 will be shifted by the same time delay. Such characteristic may be made use of to reduce the frequency shift caused by sideband imbalance in the manner described below.

FIG. 5 is a block diagram illustrating the timing dependence of the detector output signal harmonics on the modulation input of the RF phase modulator. Thus if an input signal $A \cdot \sin(2\pi f_m t)$ is applied to a black box, the output of the box can be represented as a sum of even and odd harmonics at the integral multiples of $f_m$. If the black box is stationary so that a time shift in the input signal will cause the same time shift in its output, as is true for the RF servo loop between the modulation input to the RF phase modulator and the output of the detector, when a time delay of half the period of the input signal or $\frac{1}{2}f_m$ is introduced in the input, the output of the black box becomes the same even harmonics minus the same odd harmonics as shown in FIG. 5. Therefore the amplitude S of the $f_m$ component of the detector output signal must be an odd function of the input amplitude A. Therefore an odd power series for S can be constructed.

$$S = \sum_{p=0}^{\infty} C_{2p+1} \cdot A^{2p+1}$$

where p is an integer

If the black box of FIG. 5 includes the circuit components between the modulation input to RF phase modulator 34 and the output of detector 18 of FIG. 2, the $f_3$ component of the output of detector 18 is also an odd function of the input amplitude and can be expressed as a power series for S as shown above. In reference to FIG. 2, when imperfections in the RF phase modulator causes a frequency offset in the frequency locking circuit, the amplitude S of the $f_3$ component of the output signal is the sum of the RF error signal and the offset in the RF error signal corresponding to the frequency offset. The optical cavity has a transfer function which is periodic. The sidebands of the output of the EO phase modulator recur at substantially the same period as that of the cavity. Also the subcarrier at $f_1$ feeds the EO phase modulator so that the optical modulation is phase modulation regardless of the type of RF modulation. Because of such properties, it is found that the offset in the RF error signal contains only third and higher odd powers of A while the real part of the RF error signal contains first and higher odd powers of A. While the relative amplitudes of the third and higher powers of A can be made much smaller than A by making A small, this is achieved only at the expense of reducing the signal to noise ratio. Since the detector provides the RF error signal as an averaged value, the offset in the RF error signal can be reduced by choosing an input signal to the RF phase modulator so that the average value of the third and higher powers of the signal is very small compared to the average value of the signal. This can be accomplished by amplitude modulating the input signal so that its amplitude A becomes a periodic function of time t, $A(f_e t)$, where $$\int_0^{1/f_e} A(f_e t) dt \neq 0, \quad \int_0^{1/f_e} [A(f_e t)]^p dt = 0,$$

If the two-above relations hold, the signal S averaged over a cycle of $f_e$ will depend only on $C_1$, but will not depend on higher terms $C_3, C_5, \ldots$.

In the power series equation for S above, the higher order terms are small compared to the lower order terms. Hence, if some care is taken in designing the RF phase modulator, the $C_3$ term is the only significant term so that frequency offset in the frequency locking circuit would become insignificant if the integral in the above equation vanishes for p=3. Only for a poor design might p=5 also be necessary. This envelope function $A(f_e t)$ should also be optimized to give as large an average as possible for A relative to its peak value, to give the best signal to noise ratio. FIG. 6 shows such a function where the p=3 integral vanishes. FIG. 7 shows a function where both the p=3 and p=5 integrals vanish. These particular envelope functions were optimized to give the highest ratio of average to peak value for A. The envelope functions were designed so that for every positive going transition, there is an equal sized negative going transition, causing any transient errors to cancel to first order.

FIG. 8 is a block diagram of a frequency locking circuit with sideband imbalance correction for the RF phase modulator to illustrate the preferred embodiment of one aspect of the invention. In FIG. 8, the circuit of FIG. 2 has been modified by including a double balanced mixer to modulate the $f_3$ signal by $A(f_e t)$ to correct the sideband imbalance introduced by the RF phase modulator. As noted above, if A takes on the waveform of FIG. 6, the integral of the third order term in the power series for S vanishes, so the sideband imbalance caused by imperfections in the RF phase modulator will be much reduced. Where necessary, a particular function $A(f_e t)$ can be chosen (such as the waveform in FIG. 7) so that the integrals of the fifth order term also vanishes.

In the special case of the frequency locking circuit of FIGS. 2 and 8, the transfer function of the optical cavity is periodic and the optical sidebands recur with substantially the same period. Also the optical modulation is phase modulation regardless of the type of RF modulation. For these reasons the offset in the RF error signal contains only third and higher odd powers of A. For FM frequency locking in general, however, fundamental AM will be present which provides an offset in the error signal proportional to A. Where the offset in the error signal also contains the first power of A due to the fundamental AM, it is necessary to first remove the amplitude modulation at the modulating frequency from the modulated signal before the above described technique can be applied. Removing the fundamental AM will leave sideband imbalance from even harmonic FM and higher odd harmonic AM. All of the remaining sideband imbalance will cause an offset proportional to third and higher odd powers of A.

After the amplitude modulation at the modulating frequency $f_m$ has been removed, however, the same technique as that described above in reference to FIG. 8 can be applied as before to reduce the effect of sideband imbalance and also the frequency offset in the frequency locking circuit. In the preferred embodiment shown in FIG. 9, the amplitude modulation at the modulating frequency $f_m$, or the fundamental AM, is reduced or removed by a coupled servo loop. In reference to FIG. 9, a carrier signal at frequency $f_c$ from tunable oscillator 112 is modulated by a phase modulator 114. The fundamental AM is removed by a coupled servo loop and is then filtered by a reference filter 116 having center frequency $f_f$. The filtered signal is detected by detector 118. The component of the detector output at $f_m$ is detected by means of a double balanced mixer 120 and loop filter 122 and is supplied to the tunable oscillator to adjust the carrier frequency until the error signal in the servo loop (comprising filter 116, detector 118, mixer 120 and filter 122, oscillator 112 and modulator 114) goes to zero, at which point the carrier frequency is locked to the center frequency of the filter $f_f$.

Phase modulator 114 may contain imperfections which cause an offset in the error signal in the servo loop comprising filter 116, detector 118, mixer 120 and filter 122, oscillator 112 and modulator 114. Such offset in the error signal in the servo will also cause a frequency offset, so that $f_c$ will be locked to a frequency with an offset from $f_f$, which is undesirable. As described above, provided the offset in the error signal contains only third order or higher powers of the amplitude of the modulating signal at frequency $f_m$, such offset in the error signal can be reduced or removed by modulating the amplitude of the modulating signal in the manner described above. However, if the offset in the error signal also contains first order power of A, such term must first be removed. This is accomplished by a coupled servo loop comprising filters 152, 154, detector 156, preamplifier 158, double balanced mixers 160, 162, delay 164 and matrix loop filter 166. The modulating signal at frequency $f_m$ is supplied to mixers 160, 162 at 90° phase difference. Therefore the double balanced mixers 160, 162 detect the in phase and quadrature components of the fundamental AM. The two mixer outputs feed a matrix loop filter 166 which contains at least one integrator for each channel which adjusts the center frequencies of the two filters 152, 154 until the FM to AM conversions from these two tunable filters cancel out all of the AM at $f_m$, and no such AM is seen by detector 156. Filter 154 converts FM to AM that is approximately in quadrature with the phase modulation applied by modulator 114 while the narrow filter 152 converts FM to AM which is approximately in phase with the phase modulator. While it is convenient to detect the in phase and quadrature components of the output of detector 156 as described above, other components of the amplitude modulation at $f_m$ can be detected instead provided that the sine of the difference between the phases of the two components detected is non-zero. This may be accomplished by applying a delay 164 so that the phase difference between the phase references to mixers 160, 162 is different from 90°. All such variations are within the scope of the invention. The matrix loop filter must be designed so that the coupled servo is stable This requires that the determinant of the difference between the open loop matrix transfer function around the loop and the identity matrix must not equal zero anywhere in the right half plane of the Laplace domain.

While the fundamental AM can be removed by a coupled servo as described in reference to FIG. 9, other techniques for removing the fundamental AM can also be used such as by replacing the two filters 152, 154 with a double balanced mixer and an amplitude modulator. Such different implementations for removing the fundamental AM are also within the scope of the invention. The above described apparatus and method and the details thereof are merely illustrative thereof, and various changes in the details and different implementations thereof may be within the scope of the appended claims.

I claim:

1. A frequency locking circuit comprising:
    a source of a carrier signal at frequency $f_c$;
    means for phase modulating the carrier signal by a first signal at frequency $f_m$ to produce a modulated carrier signal with sidebands, said phase modulating means containing imperfections so that the sidebands are imbalanced, said imbalance inducing modulation including amplitude modulation at $f_m$;
    means for reducing amplitude modulation at $f_m$ in the modulated carrier signal to provide an output signal;
    a filter for filtering the output signal to produce a filtered signal, said filter having a transfer function that has a characteristic resonant frequency $f_f$;
    a detector responsive to the filtered signal to produce a detector signal, wherein a time shift in the first signal will cause substantially the same time shift in the detector signal;
    means responsive to the component of the detector signal at frequency $f_m$ for adjusting the ratio $f_c/f_f$ to a fixed value N, wherein the frequency offset of the ratio caused by any sideband imbalance in the phase modulating means is reduced by reducing the amplitude modulation at $f_m$.

2. The circuit of claim 1, wherein the amplitude modulation reducing means comprises a coupled servo loop.

3. The circuit of claim 2, wherein the coupled servo loop comprises:
    second and third means for detecting two components of the amplitude modulation at $f_m$, said components having different phases, wherein the sine of the phase difference between the two components is nonzero; and
    second means responsive to the second and third detecting means for filtering the modulated carrier signal to provide the output signal with reduced amplitude modulation at $f_m$.

4. The circuit of claim 3, wherein one of the two components is substantially in phase with the signal at $f_m$ and the other substantially in quadrature with the signal at $f_m$.

5. The circuit of claim 3, wherein said second filtering means includes:
    a third and a fourth bandpass filter for sequentially filtering the modulated carrier signal to provide the output signal, said third and fourth filters having different bandwidths; and
    a fifth matrix loop filter responsive to the second and third detecting means for controlling the center frequencies of the third and fourth filters so that the filtering of the modulated carrier signal by the third and fourth filters reduces the amplitude modulation at $f_m$ in the output signal.

6. The circuit of claim 1, wherein the amplitude of the signal at $f_m$ is a periodic function A of time t at frequency $f_e$, where the function is $A(f_e t)$, and $$\int_0^{1/f_e} A(f_e t)dt \neq 0, \int_0^{1/f_e} [(f_e t)]^3 dt = 0.$$

7. The circuit of claim 6, wherein the amplitude of the signal at $f_m$ is a periodic function A of time t at frequency $f_e$, where the function is $A(f_e t)$, and $$\int_0^{1/f_e} [A(f_e t)]^5 dt = 0.$$

8. The circuit of claim 6, wherein the amplitude of the signal at $f_m$ is a periodic function A of time t at frequency $f_e$, where the function is $A(f_e t)$, and $$\int_0^{1/f_e} [A(f_e t)]^p dt = 0,$$

for at least one value of p, where p is an odd integer greater than 3.

9. The circuit of claim 6, wherein A is a substantially square wave with its amplitude alternating between 0.5 and −1 of any amplitude unit, where its amplitude remains at 0.5 for a time period that is about 8 times the time period during which the amplitude is at −1.

10. A frequency locking method comprising:
supplying a carrier signal at frequency $f_c$;
phase modulating the carrier signal by means of a phase modulator, employing a first signal at frequency $f_m$, to produce a modulated carrier signal with sidebands, said phase modulator containing imperfections so that the sidebands are imbalanced, said imbalance inducing modulation including amplitude modulation at $f_m$;
reducing amplitude modulation at $f_m$ in the modulated carrier signal to provide an output signal;
filtering the output signal with a filter having a transfer function that has a characteristic resonant frequency $f_f$, to provide a filtered signal;
detecting the filtered signal to produce a detector signal, wherein a time shift in the first signal will cause substantially the same time shift in the detector;
adjusting the ratio $f_c/f_f$ to a fixed value N in response to the component of the detector signal at frequency $f_m$, wherein the frequency offset of the ratio caused by any sideband imbalance in the phase modulating means is reduced by reducing the amplitude modulation at $f_m$.

11. A frequency locking circuit comprising:
a source of a beam of continuous wave, coherent radiation of frequency $f_o$;
means for amplitude modulating a signal at frequency $f_3$ by a signal at frequency $f_e$ to provide a modulating signal, where the signal at $f_e$ is a periodic function A of time t $A(f_e t)$, and $$\int_0^{1/f_e} A(f_e t) dt \neq 0, \int_0^{1/f_e} [A(f_e t)]^3 dt = 0,$$

means for phase modulating the beam, in response to a compound signal which is the sum of a signal at frequency $f_2$ and a FM subcarrier at frequency $f_1$ that is phase modulated by the modulating signal, to produce a phase modulated beam;
a filter through which the phase modulated beam passes, said filter having a periodic transfer function that has a characteristic frequency $f_f$, wherein the phase modulated beam has sidebands that recur at substantially the same period as the transfer function of the filter;
a detector responsive to the filtered beam to produce a detector signal;
first means responsive to the component of the detector signal substantially at frequency $f_2$, for adjusting the ratio of $f_o/f_f$ to a fixed value N; and
second means responsive to the component of the detector signal substantially at frequency $f_3$, for adjusting the ratio of $f_1/f_f$ to a fixed value M.

12. The circuit of claim 11, wherein the function A is such that:

$$\int_0^{1/f_e} [A(f_e t)]^5 dt = 0.$$

13. The circuit of claim 11, wherein the function A is such that:

$$\int_0^{1/f_e} [A(f_e t)]^p dt = 0,$$

for at least one value of p, where p is an odd integer greater than 3.

14. The circuit of claim 11, wherein said filter is a multimode filter with characteristic mode frequencies at $Nf_f$ and $(N\pm M)f_f$, wherein said first adjusting means adjusts and locks the filter mode characteristic frequency $Nf_f$ to radiation frequency $f_o$, and wherein said second adjusting means adjusts and locks the subcarrier frequency $f_1$ to M times the mode spacing of the filter, so that the radiation frequency $f_o$ is determined at least in part by measurement of the subcarrier frequency $f_1$.

15. The circuit of claim 11, wherein the filter is a multimode filter with characteristic mode frequencies at $Nf_f$ and $(N\pm M)f_f$, wherein said first adjusting means adjusts and locks the radiation frequency $f_o$ to the filter mode characteristic frequency $Nf_f$, and wherein said second adjusting means adjusts and locks an integral multiple of the filter mode spacing to the subcarrier frequency $f_1$ while the first adjusting means maintains the locking of the radiation frequency to the filter frequency, to synthesize a desired radiation frequency from the subcarrier frequency.

16. A frequency locking method comprising:
supplying a beam of continuous wave, coherent radiation of frequency $f_o$;
amplitude modulating a signal at frequency $f_3$ by a signal at frequency $f_e$ to provide a modulating signal, where the signal at $f_e$ is a periodic function A of time t $A(f_e t)$, and $$\int_0^{1/f_e} A(f_e t) dt \neq 0, \int_0^{1/f_e} [A(f_e t)]^3 dt = 0,$$

phase modulating the beam, in response to a compound signal which is the sum o a signal at frequency $f_2$ and a FM subcarrier at frequency $f_1$ that is phase modulated by the modulating signal, to produce a phase modulated beam;
filtering the phase modulated beam by means of a filter whose periodic transfer function has a characteristic frequency $f_f$, and so that the phase modulated beam has sidebands that recur at substantially the same period as that of the transfer function of the filter;
detecting the filtered beam to produce a detector signal;
adjusting the ratio of $f_o/f_f$ to a fixed value N in response to the component of the detector signal substantially at frequency $f_2$; and
adjusting the ratio of $f_1/f_f$ to a fixed value M in response to the component of the detector signal substantially at frequency $f_3$.

* * * * *

UNITED STATES PATENT AND TRADEMARK OFFICE
CERTIFICATE OF CORRECTION

PATENT NO.   : 4,862,108
DATED        : August 29, 1989
INVENTOR(S)  : Gregory M. Cutler It is certified that error appears in the above-identified patent and that said Letters Patent is hereby corrected as shown below:

Column 5, Line 59, entire phrase omitted, should read --- where p is any odd integer greater than 1 --- ;

Column 8, Line 55, "[($f_e t$)]" should read --- [A($f_e t$)] ---.

Signed and Sealed this

Twenty-fifth Day of September, 1990

Attest:

HARRY F. MANBECK, JR.

*Attesting Officer*                *Commissioner of Patents and Trademarks*